United States Patent
Cheon et al.

(10) Patent No.: US 9,054,344 B2
(45) Date of Patent: *Jun. 9, 2015

(54) ELECTROLUMINESCENT DEVICES FOR LIGHTING APPLICATIONS

(71) Applicant: Universal Display Corporation, Ewing, NJ (US)

(72) Inventors: Kwang Ohk Cheon, Holland, PA (US); Michael Inbasekaran, Ewing, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/219,855

(22) Filed: Mar. 19, 2014

(65) Prior Publication Data

US 2014/0206121 A1 Jul. 24, 2014

Related U.S. Application Data

(63) Continuation of application No. 13/614,026, filed on Sep. 13, 2012, now abandoned, which is a continuation of application No. 12/913,443, filed on Oct. 27, 2010, now Pat. No. 8,288,187.

(60) Provisional application No. 61/296,680, filed on Jan. 20, 2010.

(51) Int. Cl.
  *H01L 51/56* (2006.01)
  *H01L 51/00* (2006.01)
  *H01L 51/50* (2006.01)

(52) U.S. Cl.
  CPC ............ *H01L 51/56* (2013.01); *H01L 51/0003* (2013.01); *H01L 51/5036* (2013.01); *H01L 51/5016* (2013.01)

(58) Field of Classification Search
  CPC ............ H01L 51/5016; H01L 51/0085; H01L 51/5012; H01L 2251/552; Y10S 428/917
  USPC ........................................................ 438/47
  See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 0880303 11/1998
(Continued)

OTHER PUBLICATIONS

Foreign Office Action for corresponding Chinese Application No. 201080064906.X issued on Sep. 3, 2014.
(Continued)

*Primary Examiner* — Tracie Y Green
(74) *Attorney, Agent, or Firm* — Duane Morris LLP

(57) ABSTRACT

A method of fabricating an organic light emitting device is provided. A first electrode is provided, over which the rest of the device will be fabricated. A first organic layer is deposited over the first electrode via solution processing. The first organic layer includes:
  i. an organic host material of the first organic layer;
  ii. a first organic emitting material of the first organic layer;
  iii. a second organic emitting material of the first organic layer;
A second organic layer is deposited over and in direct contact with the first organic layer. The second organic layer includes an organic emitting material of the second organic layer. A second electrode is then deposited over the second organic layer. The device may include other layers.

13 Claims, 10 Drawing Sheets

(56) References Cited

U.S. PATENT DOCUMENTS

| | | | |
|---|---|---|---|
| 5,247,190 A | 9/1993 | Friend et al. |
| 5,427,858 A | 6/1995 | Nakamura et al. |
| 5,503,910 A | 4/1996 | Matsuura et al. |
| 5,518,824 A | 5/1996 | Funhoff et al. |
| 5,552,253 A | 9/1996 | Kovacs et al. |
| 5,681,756 A | 10/1997 | Norman et al. |
| 5,693,428 A | 12/1997 | Fujii et al. |
| 5,703,436 A | 12/1997 | Forrest et al. |
| 5,707,745 A | 1/1998 | Forrest et al. |
| 5,834,893 A | 11/1998 | Bulovic et al. |
| 5,837,391 A | 11/1998 | Utsugi |
| 5,844,363 A | 12/1998 | Gu et al. |
| 5,851,709 A | 12/1998 | Grande et al. |
| 5,853,905 A | 12/1998 | So et al. |
| 5,922,481 A | 7/1999 | Etzbach et al. |
| 5,929,194 A | 7/1999 | Woo et al. |
| 6,013,982 A | 1/2000 | Thompson et al. |
| 6,066,357 A | 5/2000 | Tang et al. |
| 6,087,196 A | 7/2000 | Sturm et al. |
| 6,091,195 A | 7/2000 | Forrest et al. |
| 6,097,147 A | 8/2000 | Baldo et al. |
| 6,107,452 A | 8/2000 | Miller et al. |
| 6,130,001 A | 10/2000 | Shi et al. |
| 6,221,438 B1 | 4/2001 | Matthies |
| 6,228,436 B1 | 5/2001 | Affinito |
| 6,294,398 B1 | 9/2001 | Kim et al. |
| 6,303,238 B1 | 10/2001 | Thompson et al. |
| 6,337,102 B1 * | 1/2002 | Forrest et al. ............... 427/64 |
| 6,372,154 B1 | 4/2002 | Li |
| 6,447,934 B1 | 9/2002 | Suzuki et al. |
| 6,468,819 B1 | 10/2002 | Kim et al. |
| 6,528,187 B1 | 3/2003 | Okada |
| 6,555,840 B1 | 4/2003 | Hudson et al. |
| 6,575,800 B1 | 6/2003 | Kobayashi et al. |
| 6,592,969 B1 | 7/2003 | Burroughes et al. |
| 6,687,266 B1 | 2/2004 | Ma et al. |
| 6,803,720 B2 | 10/2004 | Kwong et al. |
| 6,821,553 B2 | 11/2004 | Miyashita et al. |
| 6,835,469 B2 | 12/2004 | Kwong et al. |
| 6,869,695 B2 | 3/2005 | Thompson et al. |
| 6,891,326 B2 | 5/2005 | Lu |
| 6,921,915 B2 | 7/2005 | Takiguchi et al. |
| 6,982,179 B2 | 1/2006 | Kwong et al. |
| 7,009,338 B2 | 3/2006 | D'Andrade et al. |
| 7,022,421 B2 | 4/2006 | Thompson et al. |
| 7,078,113 B2 | 7/2006 | Thompson et al. |
| 7,087,321 B2 | 8/2006 | Kwong et al. |
| 7,090,928 B2 | 8/2006 | Thompson et al. |
| 7,151,339 B2 | 12/2006 | Adamovich et al. |
| 7,154,114 B2 | 12/2006 | Brooks et al. |
| 7,230,107 B1 | 6/2007 | Herron et al. |
| 7,232,618 B2 | 6/2007 | Yamada et al. |
| 7,250,226 B2 | 7/2007 | Tokito et al. |
| 7,279,704 B2 | 10/2007 | Walters et al. |
| 7,285,907 B2 | 10/2007 | D'Andrade et al. |
| 7,294,849 B2 | 11/2007 | Thompson et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,466,073 B2 | 12/2008 | Kishino et al. |
| 7,534,505 B2 | 5/2009 | Lin et al. |
| 7,655,323 B2 | 2/2010 | Walters et al. |
| 7,714,498 B2 | 5/2010 | Aoyama et al. |
| 7,768,195 B2 | 8/2010 | Jinde et al. |
| 7,862,906 B2 | 1/2011 | Abe |
| 7,871,711 B2 | 1/2011 | Itai |
| 7,968,146 B2 | 6/2011 | Wagner et al. |
| 8,007,927 B2 | 8/2011 | Lin et al. |
| 8,288,187 B2 * | 10/2012 | Cheon et al. ............... 438/46 |
| 8,580,402 B2 | 11/2013 | Lin et al. |
| 2001/0001050 A1 | 5/2001 | Miyashita et al. |
| 2001/0003602 A1 | 6/2001 | Fujita |
| 2001/0004469 A1 | 6/2001 | Himeshima et al. |
| 2001/0015432 A1 | 8/2001 | Igarashi |
| 2002/0034656 A1 | 3/2002 | Thompson et al. |
| 2002/0041926 A1 | 4/2002 | Miyashita et al. |
| 2002/0067123 A1 | 6/2002 | Seki et al. |
| 2002/0074935 A1 | 6/2002 | Kwong et al. |
| 2002/0093283 A1 | 7/2002 | Seo et al. |
| 2002/0134984 A1 | 9/2002 | Igarashi |
| 2002/0158242 A1 | 10/2002 | Son et al. |
| 2003/0054186 A1 | 3/2003 | Miyashita et al. |
| 2003/0068525 A1 | 4/2003 | Bellman et al. |
| 2003/0072964 A1 | 4/2003 | Kwong et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230747 A1 | 12/2003 | Ostergard |
| 2003/0230980 A1 | 12/2003 | Forrest et al. |
| 2004/0036077 A1 | 2/2004 | Ise |
| 2004/0037949 A1 | 2/2004 | Wright |
| 2004/0048101 A1 | 3/2004 | Thompson et al. |
| 2004/0094768 A1 | 5/2004 | Yu et al. |
| 2004/0095064 A1 | 5/2004 | Lu |
| 2004/0096570 A1 | 5/2004 | Weaver et al. |
| 2004/0115476 A1 | 6/2004 | Oshiyama et al. |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2004/0189189 A1 | 9/2004 | Burroughes et al. |
| 2005/0025993 A1 | 2/2005 | Thompson et al. |
| 2005/0046337 A1 | 3/2005 | Chin et al. |
| 2005/0074630 A1 | 4/2005 | Kanno et al. |
| 2005/0077817 A1 | 4/2005 | Yamazaki et al. |
| 2005/0112407 A1 | 5/2005 | Ogasawara et al. |
| 2005/0123751 A1 | 6/2005 | Tsutsui et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0046098 A1 | 3/2006 | Hosokawa |
| 2006/0121308 A1 | 6/2006 | Katoh et al. |
| 2006/0127696 A1 | 6/2006 | Stossel et al. |
| 2006/0141288 A1 | 6/2006 | Matsuura et al. |
| 2006/0182992 A1 | 8/2006 | Nii et al. |
| 2006/0202194 A1 | 9/2006 | Jeong et al. |
| 2006/0232194 A1 | 10/2006 | Tung |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0279203 A1 * | 12/2006 | Forrest et al. ............... 313/504 |
| 2006/0280965 A1 | 12/2006 | Kwong et al. |
| 2007/0087321 A1 | 4/2007 | Pribenszky et al. |
| 2007/0103060 A1 | 5/2007 | Itoh et al. |
| 2007/0111026 A1 | 5/2007 | Deaton et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0102310 A1 | 5/2008 | Thompson et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0261076 A1 | 10/2008 | Kwong et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0033212 A1 * | 2/2009 | Ahn et al. ............... 313/504 |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |

(56) References Cited

U.S. PATENT DOCUMENTS

| | | |
|---|---|---|
| 2009/0302743 A1 | 12/2009 | Kato et al. |
| 2009/0309488 A1 | 12/2009 | Kato et al. |
| 2010/0012931 A1 | 1/2010 | Kato et al. |
| 2010/0026175 A1 | 2/2010 | Nakayama et al. |
| 2010/0045172 A1 | 2/2010 | Hiyama et al. |
| 2010/0084966 A1 | 4/2010 | Otsu et al. |
| 2010/0090591 A1 | 4/2010 | Alleyne et al. |
| 2010/0127246 A1 | 5/2010 | Nakayama et al. |
| 2010/0141125 A1 | 6/2010 | Otsu et al. |
| 2010/0148663 A1 | 6/2010 | Tsai et al. |
| 2010/0187984 A1 | 7/2010 | Lin et al. |
| 2010/0244004 A1 | 9/2010 | Xia et al. |
| 2010/0295032 A1 | 11/2010 | Kwong et al. |
| 2011/0057559 A1 | 3/2011 | Xia et al. |
| 2011/0163302 A1 | 7/2011 | Lin et al. |
| 2011/0204333 A1 | 8/2011 | Xia et al. |
| 2013/0026452 A1 | 1/2013 | Kottas et al. |
| 2013/0119354 A1 | 5/2013 | Ma et al. |

FOREIGN PATENT DOCUMENTS

| | | |
|---|---|---|
| EP | 0954205 | 11/1999 |
| EP | 0982974 | 3/2000 |
| EP | 1030383 | 8/2000 |
| EP | 1238981 | 9/2002 |
| EP | 1589789 | 10/2005 |
| EP | 1670082 | 6/2006 |
| EP | 1701394 | 9/2006 |
| EP | 1725079 | 11/2006 |
| EP | 2034538 | 3/2009 |
| EP | 1841834 | 5/2009 |
| EP | 2350216 | 10/2009 |
| JP | 10-162955 | 6/1998 |
| JP | 2000-36386 | 2/2000 |
| JP | 2000-208254 | 7/2000 |
| JP | 2002-158091 | 5/2002 |
| JP | 2002-175887 | 6/2002 |
| JP | 2003-229272 | 8/2003 |
| JP | 2005-11610 | 1/2005 |
| JP | 2005-038672 | 2/2005 |
| JP | 2007-123392 | 5/2007 |
| JP | 2007-254297 | 10/2007 |
| JP | 2008-181937 A | 8/2008 |
| JP | 2008-282610 A | 11/2008 |
| JP | 2009-227514 | 10/2009 |
| JP | 2009-540563 A | 11/2009 |
| JP | 2010-135467 | 6/2010 |
| WO | WO 98/24271 | 6/1998 |
| WO | WO 9912396 | 3/1999 |
| WO | WO 9921935 | 5/1999 |
| WO | WO 01/39234 | 5/2001 |
| WO | WO 02/02714 | 1/2002 |
| WO | WO 02/15645 | 2/2002 |
| WO | WO 03/040257 | 5/2003 |
| WO | WO 03/060956 | 7/2003 |
| WO | WO 2004/093207 | 10/2004 |
| WO | WO 2004/107822 | 12/2004 |
| WO | WO 2004/111066 | 12/2004 |
| WO | WO 2005/014551 | 2/2005 |
| WO | WO 2005/019373 | 3/2005 |
| WO | WO 2005/030900 | 4/2005 |
| WO | WO 2005/089025 | 9/2005 |
| WO | WO 2005/123873 | 12/2005 |
| WO | WO 2006/009024 | 1/2006 |
| WO | WO 2006/056418 | 6/2006 |
| WO | WO 2006/072002 | 7/2006 |
| WO | WO 2006/082742 | 8/2006 |
| WO | WO 2006/098120 | 9/2006 |
| WO | WO 2006/100298 | 9/2006 |
| WO | WO 2006/103874 | 10/2006 |
| WO | WO 2006/114966 | 11/2006 |
| WO | WO 2006/132173 | 12/2006 |
| WO | WO 2007/002683 | 1/2007 |
| WO | WO 2007/004380 | 1/2007 |
| WO | WO 2007/063754 | 6/2007 |
| WO | WO 2007/063796 | 6/2007 |
| WO | WO 2007/145719 A1 | 12/2007 |
| WO | WO 2008/044723 | 4/2008 |
| WO | WO 2008/056746 | 5/2008 |
| WO | WO 2008/057394 | 5/2008 |
| WO | WO 2008/075517 A1 | 6/2008 |
| WO | WO 2008/101842 | 8/2008 |
| WO | WO 2008/120611 A1 | 10/2008 |
| WO | WO 2008/132085 | 11/2008 |
| WO | WO 2008/132965 A1 | 11/2008 |
| WO | WO 2008/140115 A1 | 11/2008 |
| WO | WO 2009/000673 | 12/2008 |
| WO | WO 2009/003898 | 1/2009 |
| WO | WO 2009/008311 | 1/2009 |
| WO | WO 2009/018009 | 2/2009 |
| WO | WO 2009/021126 | 2/2009 |
| WO | WO 2009/030981 | 3/2009 |
| WO | WO 2009/050290 | 4/2009 |
| WO | WO 2009/062578 | 5/2009 |
| WO | WO 2009/063833 | 5/2009 |
| WO | WO 2009/066778 | 5/2009 |
| WO | WO 2009/066779 | 5/2009 |
| WO | WO 2009/086028 | 7/2009 |
| WO | WO 2009/100991 | 8/2009 |
| WO | WO 2010/011390 | 1/2010 |
| WO | WO 2010/028151 | 3/2010 |
| WO | WO 2010/028262 | 3/2010 |
| WO | WO 2010/056066 | 5/2010 |
| WO | WO 2010/079051 | 7/2010 |
| WO | WO 2010/086089 | 8/2010 |
| WO | WO 2010/107244 | 9/2010 |
| WO | WO 2010/111175 | 9/2010 |
| WO | WO 2011/044988 | 4/2011 |
| WO | WO 2011/051404 | 5/2011 |
| WO | WO 2011/075644 | 6/2011 |
| WO | WO 2011/086863 | 7/2011 |
| WO | WO 2011/090535 A1 | 7/2011 |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

Adachi, Chihaya et al., "Organic Electroluminescent Device Having a Hole Conductor as an Emitting Layer," Appl. Phys. Lett., 55(15):1489-1491 (1989).

Adachi, Chihaya et al., "High-Efficiency Red Electrophosphorescence Devices," Appl. Phys. Lett., 78(11):1622-1624 (2001).

Adachi, Chihaya et al., "Nearly 100% Internal Phosphorescence Efficiency in an Organic Light Emitting Device," J. Appl. Phys., 90(10):5048-5051 (2001).

Aonuma, Masaki et al., "Material Design of Hole Transport Materials Capable of ThickFilm Formation in Organic Light Emitting Diodes,"Appl. Phys. Lett., 90:183503-1-183503-3 (2007).

Chang, Chiung-Fang et al, "Highly Efficient Blue-Emitting Iridium(III) Carbene Complexes and Phosphorescent OLEDs," Angew. Chain. Int. Ed. 47, 4542 (2008).

Gao, Zhigiang et al., "Bright-Blue Electroluminescence From a Silyl-Substituted ter-(phenylene-vinylene) derivative," Appl. Phys. Lett., 74(6):865-867 (1999).

Guo, Tzung-Fang et al., "Highly Efficient Electrophosphorescent Polymer Light-Emitting Devices," Organic Electronics, 1:15-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High $T_g$ Hole-Transport Molecules Based on Indolo[3,2-b]carbazoles for Organic Light-Emitting Devices," Synthetic Metals, 111-112:421-424 (2000).

(56) References Cited

OTHER PUBLICATIONS

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of $CHF_3$,"Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185: Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials,"J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4''-Tri(N-carbazolyl)triphenylamine (TCTA) and 4,4',4''-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1):162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter,"Appl. Phys. Lett., 77(15):2280-2282 (2000).

Lo, Shih-Chun et al., "Blue Phosphorescence from Iridium(III) Complexes at Room Temperature," Chem. Mater., 18(21):5119-5129 (2006).

Ma, Yuguang et al., "Triplet Luminescent Dinuclear-Gold(I) Complex-Based Light-Emitting Diodes with Low Turn-On voltage,"Appl. Phys. Lett., 74(10):1361-1363 (1999).

Mi, Bao-Xiu et al., "Thermally Stable Hole-Transporting Material for Organic Light-Emitting Diode: an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4):592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Östergård, T. et al., "Langmuir-Blodgett Light-Emitting Diodes of Poly(3-Hexylthiophene): Electro-Optical Characteristics Related to Structure," Synthetic Metals, 87:171-177 (1997).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers,"J. Am. Chem. Soc., 122(8):1832-1833 (2000).

Salbeck, J. et al., "Low Molecular Organic Glasses for Blue Electroluminescence," Synthetic Metals, 91:209-215 (1997).

Shirota, Yasuhiko et al., "Starburst Molecules Based on π-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

Takizawa, Shin-ya et al., "Phosphorescent Iridium Complexes Based on 2-Phenylimidazo[1,2- α]pyridine Ligands: Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., " Highly Efficient Red Phosphorescent Osmium(II) Complexes for OLED Applications," Organometallics 23, 3745 (2004).

Tung, Yung-Liang et al., "Organic Light-Emitting Diodes Based on Charge-Neutral $Ru^{II}$ Phosphorescent Emitters," Adv. Mater., 17(8):1059-1064 (2005).

Van Slyke, S. A. et al., "Organic Electroluminescent Devices with Improved Stability," Appl. Phys. Lett., 69(15): 2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung et al., "Multifunctional Iridium Complexes Based on Carbazole Modules as Highly Efficient Electrophosphors," Angew. Chem. Int. Ed., 45:7800-7803 (2006).

Search/Examination report corresponding to the PCT/US2010/056021 application, Nov. 2010.

Search Report corresponding to the PCT/US2009/056066 application, Oct. 2009.

Tanaka et al.: "High Luminous Efficiency Blue Organic Light-Emitting Devices Using High Triplet Excited Energy Materials" Japanese Journal of Applied Physics, Japan Society of Applied Physics, Tokyo, JP, vol. 46, No. 4-7, Feb. 1, 2007, pp. L117-L119.

Son, Kyung Soo et al.: "Blue organic electrophosphorescence diodes using diarylamino-substituted heterocyclic compounds as host material" Journal of Photopolymer Science and Technology, vol. 20, No. 1, 2007, pp. 47-51.

Adamovich, V.I. et al., "Improving the performance of PHOLEDs by using dual doping" Proc. of SPIE, vol. 7051, Aug. 26, 2008, pp. 70510D-1-70510D-8.

Holmes, R et al.: "Saturated deep blue organic electrophosphorescence using a fluorine-free emitter" Applied Physics Letters, AIP, American Institute of Physics, Melville, NY, US, vol. 87, No. 24, Dec. 7, 2005, pp. 243507-243507.

Park, Y.R. at al: "Organic light-emitting devices with In-doped (4 at. %) ZnO thin films as the anodic electrode" Japanese Journal of Applied Physics, Japan Society of Applied Physics, Tokyo, JP, vol. 47, No. 1, Jan. 1, 2008, pp. 468-471.

Dodabalapur et al., "Physics and applications of organic microcavity light emitting diodes," J. Appl. Phys. 80 (12), Dec. 15, 1996.

(56) References Cited

OTHER PUBLICATIONS

So et al., "Bipolar Carrier Transport in Organic Small Molecules for OLED," Proceedings of the Society for Information Display. 38, 1497 (2007).

D'Andrade, B.W., J.-Y. Tsai, C. Lin, M.S. Weaver, P.B. Mackenzie, and J.J. Brown, Efficient white phosphorescent organic light-Emitting devices, Long Beach, CA, United States, 2007 (Society for Information Display, San Jose, CA 95112-4006, United States), p. 1026-1029.

D'Andrade, B., M.S. Weaver, and J.J. Brown, White phosphorescent organic light emitting devices, SPIE 6655, 6332-6334 (2007).

D'Andrade, B.W., R.J. Holmes, and S.R. Forrest, Efficient organic electrophosphorescent whitelight-emitting device with a triple doped emissive layer, Advanced Materials 16, 624-628 (2004).

D'Andrade, B.W., and S.R. Forrest, White organic light-emitting devices for solid-state lighting, Advanced Materials 16, 1585-1595 (2004).

D'Andrade, B.W., Brooks, V. Adamovich, M.E. Thompson, and S.R. Forrest, White light emission using triplet excimers in electrophosphorescent organic light-emitting devices, Advanced Materials 14, 1032-1036 (2002).

Adamovich, J. Brooks, A. Tamayo, A.M. Alexander, P.I. Djurovich, B.W. D'Andrade, C. Adachi, S.R. Forrest, and M.E. Thompson, High efficiency single dopant white electrophosphorescent light emitting diodes, New Journal of Chemistry 26, 1171-1178 (2002).

International Search Report and Written Opinion corresponding to the PCT/IB2007/004687 application mailed May 7, 2009.

Baldo et al., "High-efficiency fluorescent organic light-emitting devices using a phosphorescent sensitizer", Nature, Nature Publishing Group, London, UK, vol. 403, Feb. 17, 2000, pp. 750-753.

Namdas, E.E., T.D.Anthopoulos, I.D.W.Samuel, Applied Physics Letters 86, 161104 (2005).

Adamovich, Vadim, Novel materials and techniques of fabrication for organic light emitting diodes. PhD, Thesis. Published Nov. 25, 2003.

Anthopoulos, T.D., M.J. Frampton, E.B. Namdas, P.L. Burn, I.D.W. Samuel, Adv. Mater. 2004, 16, No. 6, Mar. 18, pp. 557-560.

Miessler, Gary L. and Donald A. Tarr "Inorganic Chemistry" (2nd Edition) Pentice-Hall, pp. 1-3; 422-424 (1998).

International Search Report in the corresponding PCT application No. PCT/US2009/030545, Apr. 2009.

Yang et al., "Use of Poly(0-vinylcarbazole) as Host Material for Iridium Complexes in High-Efficiency Organic Light-Emitting Devices", Ipn. J. Appl. Phys., vol. 39, pp. L828•L829, part 2, No. 8A, Aug. 1, 2000.

Chen et al., "High-performance polymer light-emitting diodes doped with a red phosphorescent iridium complex", Applied Physics Letters, vol. 80, No. 13, pp. 2308-2310, Apr. 1, 2002.

Domercq et al., "Photo-Crosslinkable Polymers as Hole-Transport Materials for Organic Light-Emitting Diodes", Organic Photonic Materials and Devices IV, Proceedings of SPIE, vol. 4642, pp. 88-96, 2002.

Ma, Dongge et al., "Novel Heterolayer Organic Light-Emitting Diodes Based on a Conjugated Dendrimer", Adv. Funct. Mater. 2002, 12, No. 8, Aug.

Lo, Shih-Chun et al., "Green Phosphorescent Dendrimer for Light-Emitting Diodes", Adv. Mater. 2002, 14, No. 13-14, Jul. 4.

Muller, D. et al., "Novel cross-linkable hole-transport monomer for use in organic light emitting diodes", Synthetic Metals, 111-112, pp. 31-34,2000.

Lamansky, S. et al., "Highly Phosphorescent Bis-Cyclometalated Iridium Complexes: Synthesis, Photophysical Characterization, and Use in Organic Light Emitting Diodes", J. Am. Chem. Soc. 2001, vol. 123, No. 18, pp. 4304-4312.

Contoret, A.E.A. et al., "The Photopolymerization and Cross-Linking of Electroluminescent Liquid Crystals Containing Methacrylate and Diene Photopolymerizable End Groups for Multilayer Organic Light-Emitting Diodes", Chem. Mater. 2002, vol. 14, No. 4, pp. 1477-1487, Apr. 2002.

Bellmann, E. et al., "New Triarylamine-Containing Polymers as Hole Transport Materials in Organic Light-Emitting Diodes: Effect of Polymer Structure and Cross-Linking on Device Characteristics", Chem. Mater. 1998, vol. 10, No. 6, pp. 1668-1676.

Klarner, G. et al., "Cross-linkable Polymers Based on Dialkylfluorenes", Chem. Mater. 1999, vol. 11, No. 7, pp. 1800-1805.

Bacher, A. et al., "Photo-Cross-Linked Triphenylenes as Novel Insoluble Hole Transport Materials in Organic LEOs", Macromolecules 1999, vol. 32, No. 14, pp. 4551-4557.

O'Connor, S.J.M. et al., "Towards Full Colour LEP Displays", Proceedings of SPIE, vol. 4105, pp. 9-17, 2001.

Chen, J.P. et al., "Efficient, blue light-emitting diodes using cross-linked layers of polymeric arylamine and fluorene", Synthetic Metals 107, pp. 129-135, 1999.

Hebner, T.R. et al., "Local tuning of organic light-emitting diode color by dye droplet application", Applied Physics Letters, vol. 73, No. 13, pp. 1775-1777, Sep. 28, 1998.

Kunugi, Y. et al., "A Vapochromic LED", J. Am. Chem. Soc. 1998, vol. 120, No. 3, pp. 589-590.

Vaeth, K.M. et al., "Light-emitting diodes based on phosphorescent guest/polymeric host systems", Journal of Applied Physics, vol. 92, No. 7, pp. 3447-3453, Oct. 1, 2002.

Shimoda, T. et al., "Current Status and Future of Light-emitting Polymer Display Driven by Poly-Si TIT", SID 99 Digest, pp. 372-375.

Shimoda, T. et al., "Multicolor Pixel Patterning of Light-Emitting Polymers by Ink-Jet Printing", SID 99 Digest, pp. 376-379.

Cho, H.N. et al., "Synthesis and luminescent characteristics of fluorene-based polymers containing diacetylene unit", Synthetic Metals 111-112, pp. 429-431, 2000.

Zhang, Y. et al., "Photo-crosslinkable polymers as hole-transport materials for organic light-emitting diodes", J. Mater. Chem. 2002 12 pp. 1703-1708.

Kruger, H. et al., "Polymer multilayer systems for electronic applications", Synthetic Metals 127, pp. 267-271, 2002.

Li, X. et al., "A blue light emitting copolymer with charge transporting and photo-crosslinkable functional units", Synthetic Metals 84, pp. 437-438, 1997.

Chwang, A.B. et al., "Graded mixed-layer organic light-emitting devices", Applied Physics Letters, vol. 80, No. 5, pp. 725-727 Feb. 4, 2002.

U.S. Appl. No. 60/763,189, filed Jan. 27, 2006.
U.S. Appl. No. 61/065,131, filed Feb. 9, 2008.
U.S. Appl. No. 61/094,145, filed Sep. 4, 2008.
U.S. Appl. No. 61/296,680, filed Jan. 20, 2010.
Japanese Office Action mailed Jan. 7, 2014, in JP Appl. No. 2012-549984.

* cited by examiner

ELECTROLUMINESCENT DEVICES FOR LIGHTING APPLICATIONS

This application is a continuation of, and claims benefit of U.S. Non-Provisional application Ser. No. 13/614,026, filed on Sep. 13, 2012, which is a continuation of U.S. Non-Provisional application Ser. No. 12/913,443, filed on Oct. 27, 2010, now issued as U.S. Pat. No. 8,288,187, which claims priority to U.S. Provisional application No. 61/296,680, filed Jan. 20, 2010, the disclosures of which are herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more particularly to organic light emitting devices that include a solution deposited emissive layer.

Organic light emitting devices (OLEDs) make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

The color of an OLED device may be measured using CIE coordinates, which are well known to the art. Unless otherwise specified, CIE coordinates as used herein refer to 1931 CIE coordinates.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A "solution processed" layer refers to a layer that was deposited using a liquid medium. Examples of solution deposition techniques include spin coating, dip coating, slot dye coating, roll-to-roll coating and ink-jet printing.

More details on OLEDs, and the definitions described above, can be found in U.S. Pat. No. 7,279,704, which is incorporated herein by reference in its entirety.

SUMMARY OF THE INVENTION

An method of fabricating an organic light emitting device is provided. A first electrode is provided, over which the rest of the device will be fabricated. A first organic layer is deposited over the first electrode via solution processing. The first organic layer includes:
  i. an organic host material of the first organic layer;
  ii. a first organic emitting material of the first organic layer;
  iii. a second organic emitting material of the first organic layer;

A second organic layer is deposited over and in direct contact with the first organic layer. The second organic layer includes an organic emitting material of the second organic layer. A second electrode is then deposited over the second organic layer. The device may include other layers.

Preferably, the first organic emitting material of the first organic layer has a peak emissive wavelength in the visible spectrum of 590-700 nm, the second organic emitting material of the first organic layer has a peak emissive wavelength in the visible spectrum at 500-590 nm and the organic emitting material of the second organic layer has a peak emissive wavelength in the visible spectrum of 400-500 nm.

Preferably, the first organic emitting material of the first organic layer is present in the first organic layer in a concentration of 0.01-5 wt %, and the second organic emitting material of the first organic layer is present in the first organic layer in a concentration that is 1.1 to 500 times the concentration of the concentration of the first organic emitting material. In addition, the second organic emitting material of the first organic layer is present in an amount not more than 40 wt %. Percentages are given as weight percentages of the organic layer after fabrication, and may generally be determined by using the relative weight percentages in solution of the various materials to be deposited, because the solvent evaporates.

More preferably, the first organic emitting material of the first organic layer is present in the in the first organic layer in a concentration of 0.2-4 wt %, and the second organic emitting material of the first organic layer is present in the first organic layer in a concentration that is 2 to 200 times the concentration of the concentration of the first organic emitting material. In addition, the second organic emitting material of the first organic layer is present in an amount not more than 40 wt %.

Preferably, the first organic emitting material of the first organic layer, the second organic emitting material of the first organic layer, and the organic emitting material of the second organic layer are all small molecule materials.

Preferably, the second organic layer comprises an organic host and the organic emitting material of the second organic layer. Preferably, the second organic layer is deposited by vapor deposition, where the organic host of the second organic layer and the organic emitting material of the second organic layer are co-deposited. Vapor deposition includes vapor thermal evaporation (VTE), organic vapor phase deposition (OVPD), and organic vapor jet printing (OVJP).

Preferably, the method also includes, prior to depositing the first organic layer, the steps of:

depositing a third organic layer comprising an organic material of the third organic layer over the first electrode via solution processing; and depositing a fourth organic layer comprising an organic material of the fourth organic layer over the third organic layer via solution processing.

Preferably the third organic layer does not dissolve when the fourth organic layer is deposited, and the fourth organic layer does not dissolve when the first organic layer is deposited.

Preferably, the organic light emitting device emits light having a CIE coordinate of x coordinate in the range of 0.15-0.65, and y coordinate in the range of 0.1-0.7. More preferably, the organic light emitting device emits light having a CIE coordinate of x coordinate in the range of 0.25-0.5, and y coordinate in the range of 0.2-0.5.

The layers may include materials other than those specified. For example, the first organic layer may further comprises a third organic emitting material of the first organic layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
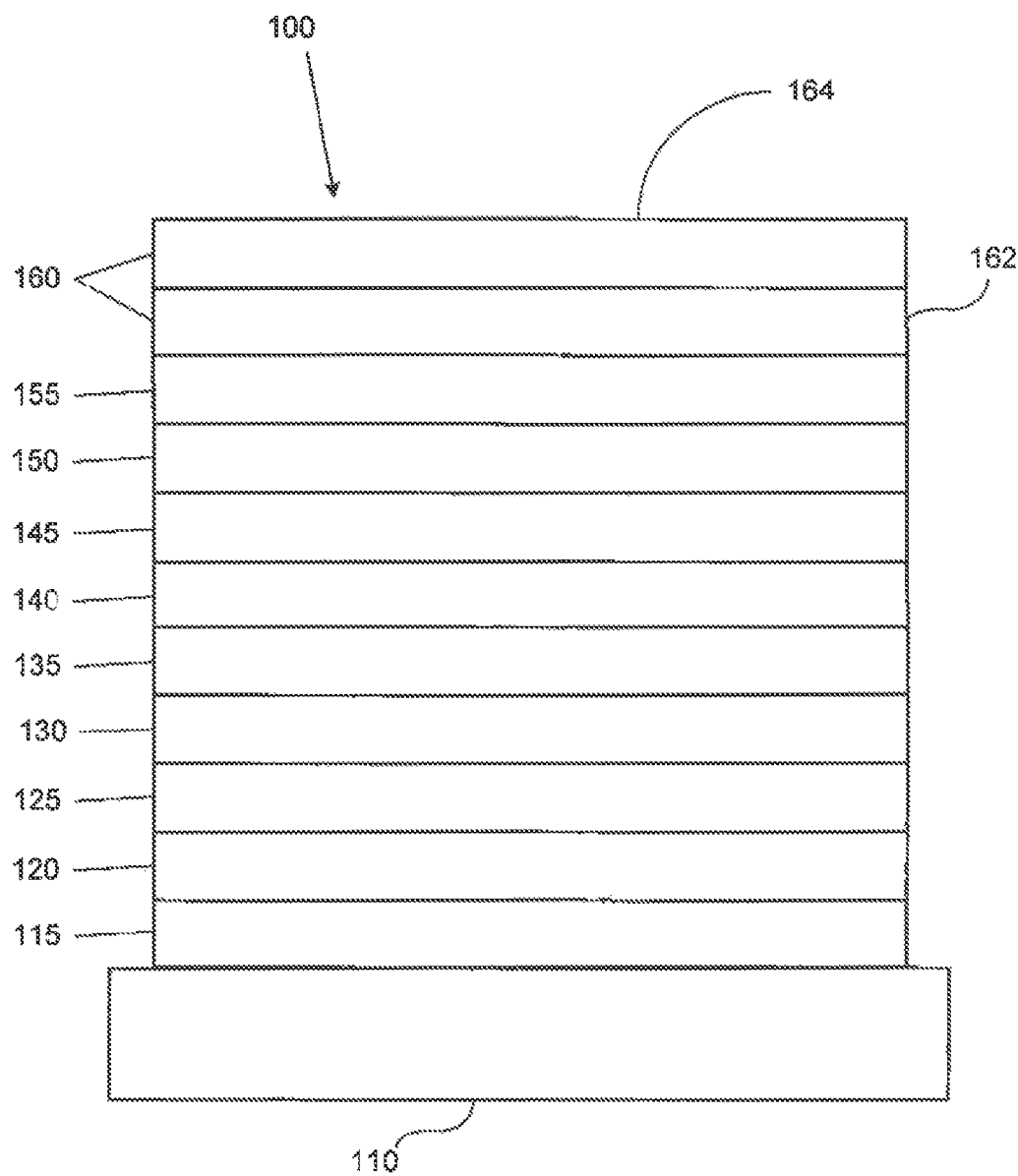
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
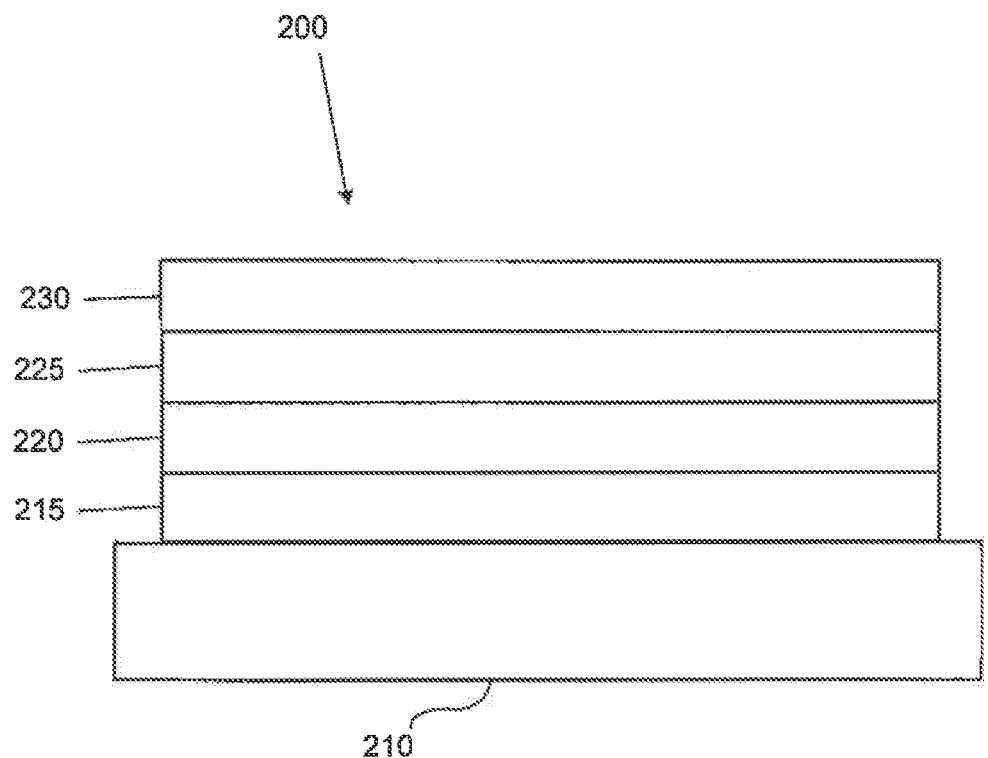
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

An method of fabricating an organic light emitting device is provided. A first electrode is provided, over which the rest of the device will be fabricated. A first organic layer is deposited over the first electrode via solution processing. The first organic layer includes:
  i. an organic host material of the first organic layer;
  ii. a first organic emitting material of the first organic layer;
  iii. a second organic emitting material of the first organic layer.

A second organic layer is deposited over and in direct contact with the first organic layer. The second organic layer includes an organic emitting material of the second organic layer. A second electrode is then deposited over the second organic layer. The device may include other layers.

Figure 3:
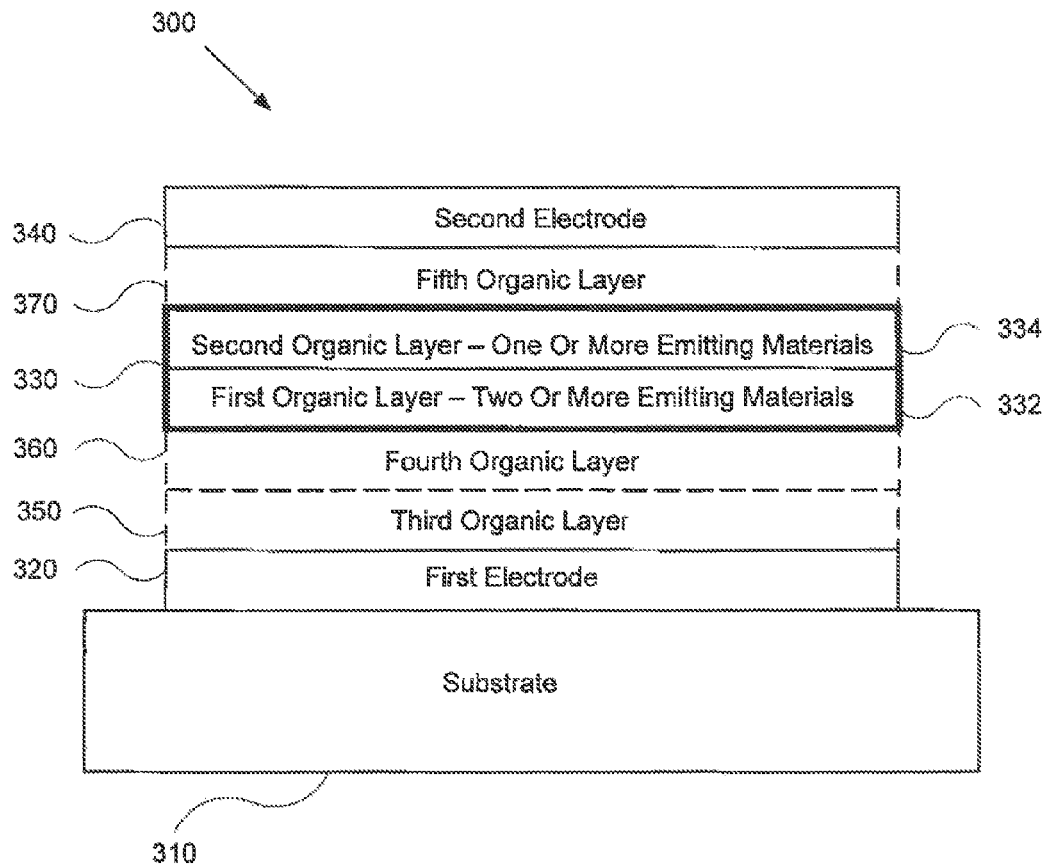
FIG. 3 shows an organic light emitting device including a solution deposited emissive layer that includes co-doped emissive materials.

FIG. 3 shows an example of device 300 fabricated using the described method. The device is fabricated on a substrate 310. The device includes a first electrode 320, emitting layers 330 disposed over the first electrode 320, and a second electrode 340 disposed over the emitting layers 330. Emitting layers 330 include first organic layer 332 and second organic layer 334. First electrode 320 is preferably an anode and second electrode 340 is preferably a cathode, but other configurations may be used.

First electrode 320 may be provided by any suitable method, including the purchase of commercially available substrates pre-coated with indium tin oxide (ITO) or other electrode material. First organic layer 332 is deposited via solution deposition over first electrode 320. The solution used to deposit first organic layer 332 includes a solvent, the organic host material of the first organic layer; the first organic emitting material of the first organic layer; and the second organic emitting material of the first organic layer. Other materials may be included. Second organic layer 334 is deposited over and in direct contact with first organic layer 332. Second organic layer 334 includes an organic emitting material of the second organic layer. Second electrode 340 is subsequently deposited over second organic layer 334 by any suitable technique.

Device 300 as illustrated also includes optional layers. A third organic layer 350 and a fourth organic layer 360 are disposed between emitting layers 330 and first electrode 320. Where first electrode 320 is an anode, third organic layer 350 may be a hole injection layer and fourth organic layer may be a hole transport layer. A fifth organic layer 370 is disposed between emitting layers 330 and second electrode 340. Where second electrode 340 is a cathode, fourth organic layer 370 may include a hole blocking layer, and an electron transport layer. Third, fourth and fifth organic layers 350, 360 and 370 may include sublayers, and may include other layers useful in various OLED architectures, many of which are described with respect to FIGS. 1 and 2.

Preferably, the first organic emitting material of first organic layer 332 has a peak emissive wavelength in the visible spectrum of 590-700 nm, the second organic emitting material of first organic layer 332 has a peak emissive wavelength in the visible spectrum at 500-590 nm and the organic emitting material of second organic layer 334 has a peak emissive wavelength in the visible spectrum of 400-500 nm. These peak wavelengths correspond roughly to red, green, and blue emitters, and are useful for obtaining a device that emits white light that would be useful, for example, for general illumination purposes.

Preferably, the first organic emitting material of first organic layer 332 is present in first organic layer 332 in a concentration of 0.01-5 wt %, and the second organic emitting material of first organic layer 332 is present in the first organic layer in a concentration that is 1.1 to 500 times the concentration of the concentration of the first organic emitting material. In addition, the second organic emitting material of first organic layer 332 is present in an amount not more than 40 wt %. Percentages are given as weight percentages of the organic layer after fabrication, and may generally be determined by using the relative weight percentages in solution of the various materials to be deposited, because the solvent evaporates. More preferably, the first organic emitting material of first organic layer 332 is present in the in first organic layer 332 in a concentration of 0.2-4 wt %, and the second organic emitting material of first organic layer 332 is present in first organic layer 332 in a concentration that is 2 to 200 times the concentration of the concentration of the first organic emitting material. In addition, the second organic emitting material of first organic layer 332 is preferably present in an amount not more than 40 wt %.

Preferably, the first organic emitting material of first organic layer 332, the second organic emitting material of first organic layer 332, and the organic emitting material of second organic layer 334 are all small molecule materials. Many small molecule materials are suitable for solution deposition, or may be readily modified to render them suitable for solution deposition using known techniques involving the addition of bulky substituents.

Preferably, second organic layer 334 comprises an organic host and the organic emitting material of second organic layer 334. Preferably, second organic 334 layer is deposited by vapor deposition, where the organic host of second organic layer 334 and the organic emitting material of second organic layer 334 are co-deposited. Vapor deposition includes vapor thermal evaporation (VTE), organic vapor phase deposition (OVPD), and organic vapor jet printing (OVJP). Vapor deposition is preferred because treatments to render underlying layers (such as first organic layer 332) insolvent often involve steps that would be detrimental to emitting materials. However, where techniques exist for solution depositing one emissive layer over another, those techniques may be used to deposit second organic layer 334 over first organic layer 332.

Third and fourth organic layers 350 and 360, when present, are preferably deposited via solution deposition techniques. Because these organic layers do not include emitting materials, material and processing choices are readily available that render these layers insoluble in a solvent used to deposit subsequent layers. One such process choice is baking to cross-link the material, rendering it insoluble.

Preferably, the organic light emitting device emits light having a CIE coordinate of x coordinate in the range of 0.15-0.65, and y coordinate in the range of 0.1-0.7. More preferably, the organic light emitting device emits light having a CIE coordinate of x coordinate in the range of 0.25-0.5, and y coordinate in the range of 0.2-0.5. These CIE coordinates are readily obtainable using the preferred peak wavelength choices for the emitting materials of the device.

One issue that the inventors have identified and solved relates to the first organic layer. The preferred percentages are useful for fabricating a device that emits white light. However, using the preferred wavelengths and amounts for the first and second emitting materials of first organic layer 332 means that first organic layer 332 includes a small amount of red dopant, and a larger amount of green dopant. To achieve white emission from the overall device, the amount of red dopant will generally be small, both in absolute terms and relative to the amount of green dopant. This is because when a red dopant is co-doped with a green dopant, excitons may preferentially move to the red dopant or transfer from the green dopant to the red dopant due to the lower energy of the red dopant. Due to this preferential emission from the red dopant, a significantly smaller amount of red and larger amount of green is needed than if the materials were in separate layers. In addition, the amount of emission from red dopant relative to green dopant is highly sensitive to small variations in the concentrations of the dopants, again due to the preferential emission from the red dopant.

Controlling the amount of dopant deposited via vapor deposition techniques such as VTE generally involves adjusting temperatures, aperture sizes and relative flow rates of materials. The variance in the amount of dopant deposited from run to run is typically about 5%. So if it were desired to deposit a layer having 1 wt % of red dopant, the actual amount of red dopant would be about 0.95 wt % to 1.05 wt %. Where the device includes a layer having co-doped red and green dopants (and the green dopant will also be expected to have a 5% variance), the variance is large enough to significantly alter the CIE coordinates of a device.

However, controlling the amount of dopant for solution process techniques generally involves weighing the various materials and adding them to a solvent in carefully controlled amounts. In the inventors laboratory, a weight as low as 0.001 g of red dopant can be measured for use in solution using a micro balance with a precision of 0.00001 g (plus or minus). In this case, variance is 1%. This reduction in variance is expected to significantly improve the reproducibility of the CIE coordinates of the finished device.

Particularly preferred concentrations for a layer including only red and green dopants are about 1 wt % for the red dopant and about 12 wt % for the green dopant. Other combinations of dopants, and other concentrations may be used. A solution processed emitting layer may include three or more emitting materials. An example of this useful for a white-emitting device is a layer that includes 72 wt % host, 20 wt % green emitter, 5 wt % yellow and 3 wt % red. Another example is 68.9 wt % host, 30 wt % green, 1% red1, and 0.1% red2 where red1 and red2 are different red emitting materials.

Other types of dopants may be used, and dopants in addition to those specifically described may be used. For example, the first organic layer may further comprises a third organic emitting material of the first organic layer. A third organic dopant may be useful, for example, to add an additional emission color to fine tune the overall emission of the device, to adjust conductivity, or other uses.

Emissive "dopants" may include phosphorescent emitting organic materials or fluorescent organic emitting materials.

Figure 4:
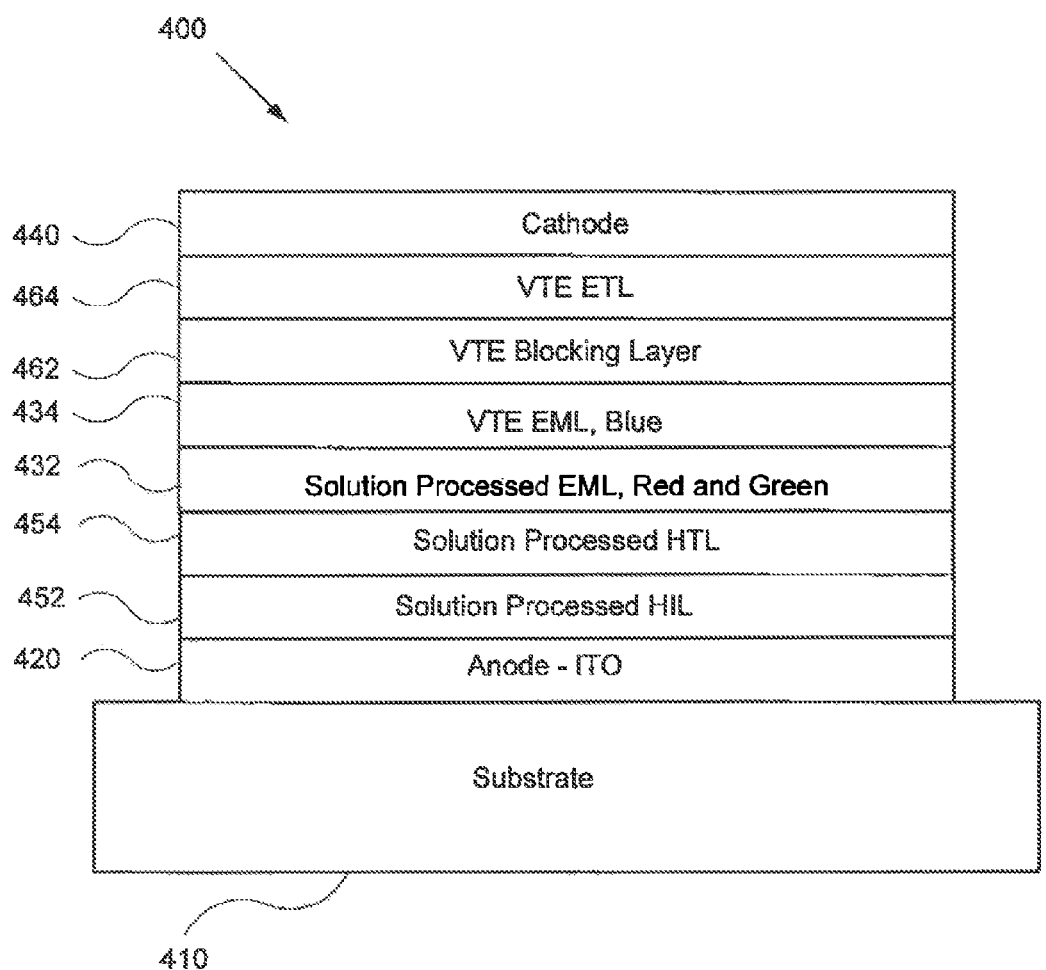
FIG. 4 shows an organic light emitting device including a solution deposited emissive layer that includes co-doped emissive materials, with more detail than FIG. 3.

A preferred device structure is illustrated in FIG. 4. Device 400 is a preferred specific structure of device 300. Device 400 is fabricated on a substrate 410, and includes, in order, anode 420, solution processed organic hole injection layer 452, solution processed organic hole transport layer 454, solution processed organic emissive layer 432, VTE deposited organic emissive layer 434, VTE deposited organic blocking layer 462, VTE deposited organic electron transport layer 464 and cathode 440. Solution processed organic emissive layer 432 includes a host and red and green emitting dopants, and VTE deposited organic emissive layer 434 includes a host and a blue emitting dopant.

Figure 5:
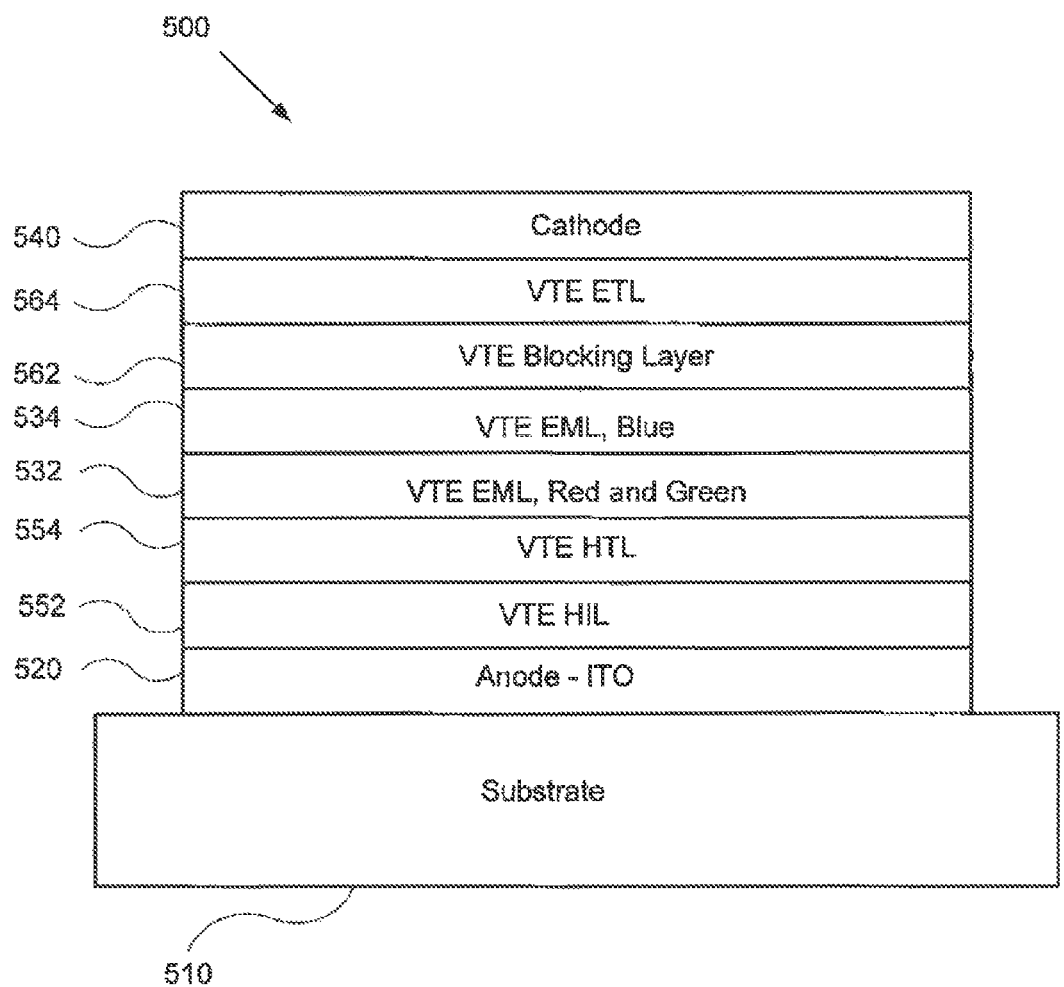
FIG. 5 shows an organic light emitting device including a vapor deposited emissive layer that includes co-doped emissive materials.

FIG. 5 shows a comparative example that does not include a solution deposited layer having multiple emissive dopants. Device 500 is fabricated on a substrate 510, and includes, in order, anode 520, VTE deposited organic hole injection layer 552, VTE deposited organic hole transport layer 554, VTE deposited organic emissive layer 532, VTE deposited organic emissive layer 534, VTE deposited organic blocking layer 562, VTE deposited organic electron transport layer 464 and cathode 440. VTE deposited organic emissive layer 532 includes a host and red and green emitting dopants, and VTE deposited organic emissive layer 534 includes a host and a blue emitting dopant.

Figure 6:
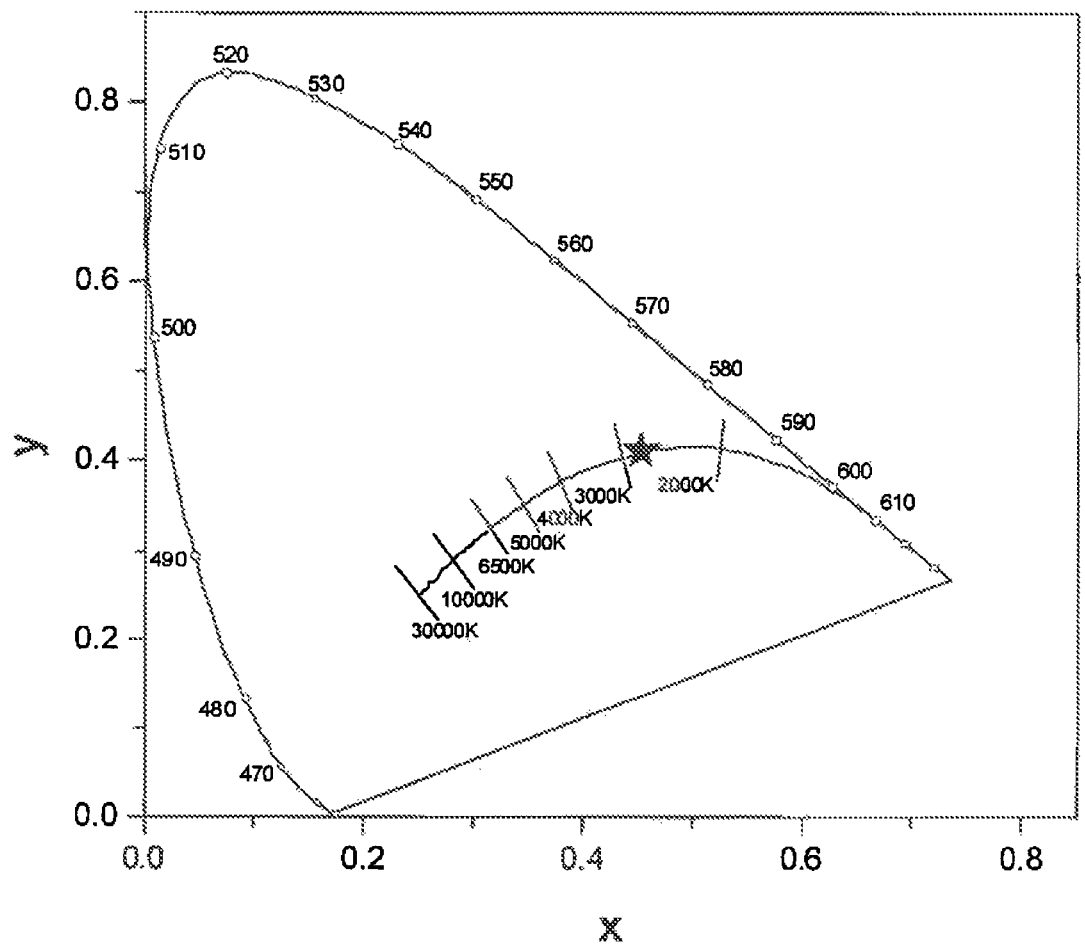
FIG. 6 shows a 1931 CIE diagram illustrating a CIE coordinate for a white device having a solution deposited co-doped emissive layer.
Figure 7:
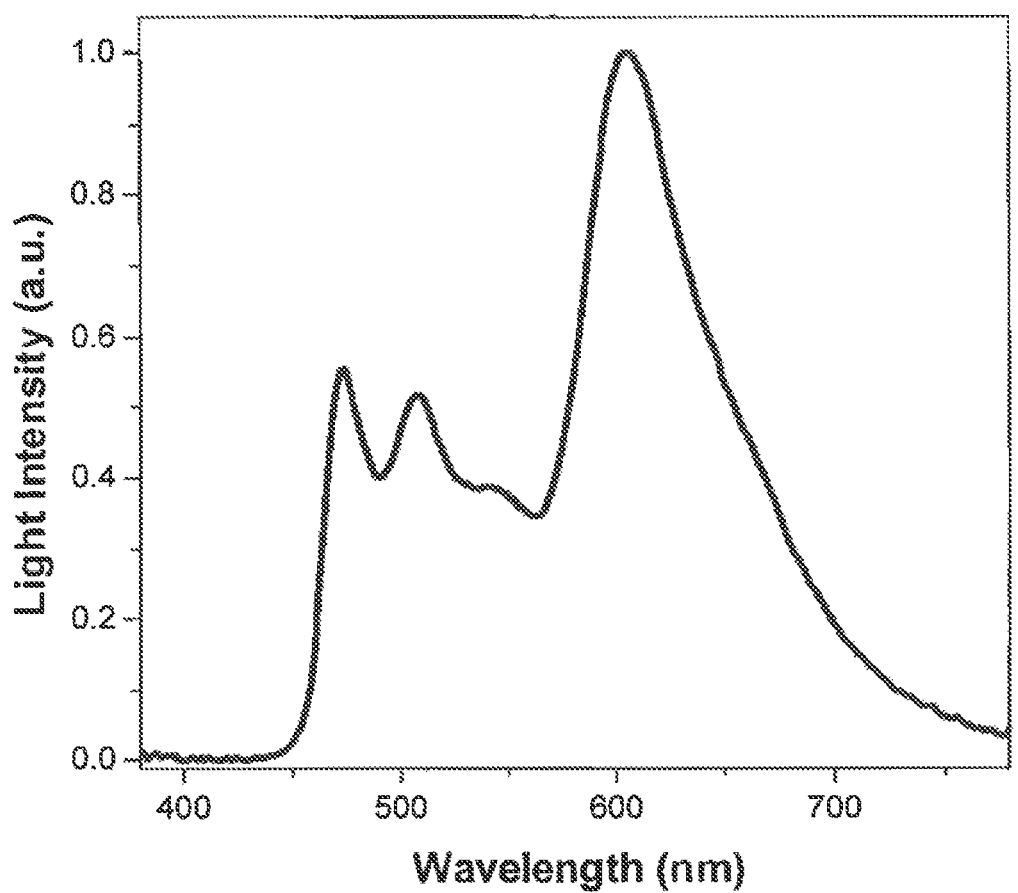
FIG. 7 shows an emissive spectrum for the white device that generated the CIE coordinate of FIG. 6.

FIG. 6 shows a CIE diagram. The star is located at a target CIE coordinate that is desirable for white emission. The curve on which the star is located is the well-known black-body radiation curve, which describes the color of thermal radiation from an object that absorbs all electromagnetic radiation that falls on it (a "black body"). FIG. 7 shows a target spectrum calculated using the emission spectra of the red, green and blue emitting materials of Example 1.

Materials

The following materials were used in the Examples:

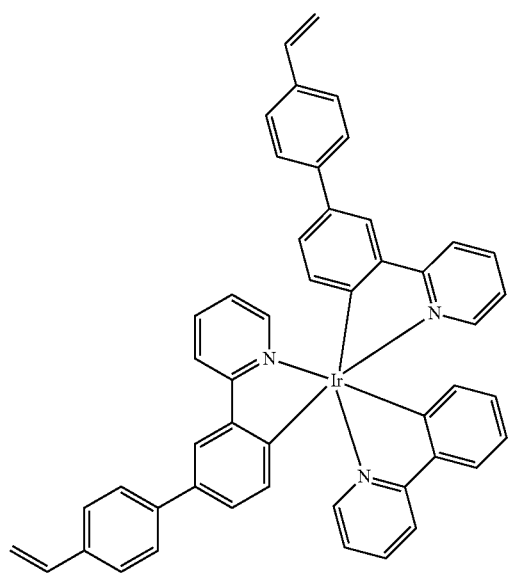

HIL-1

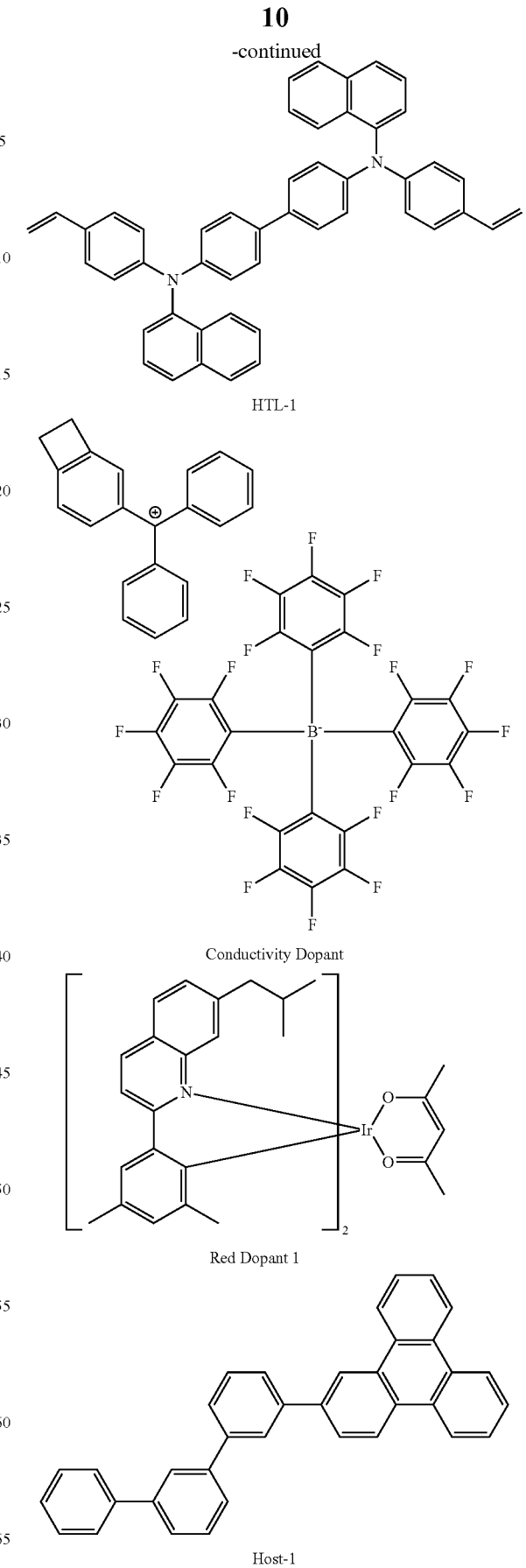

-continued

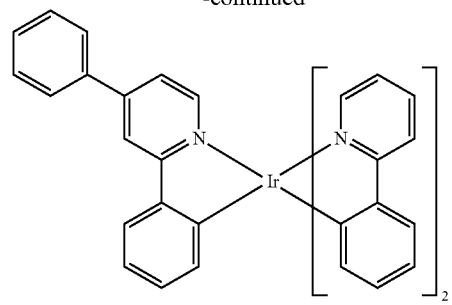

Green Dopant-1

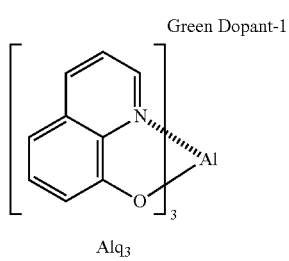

Alq3

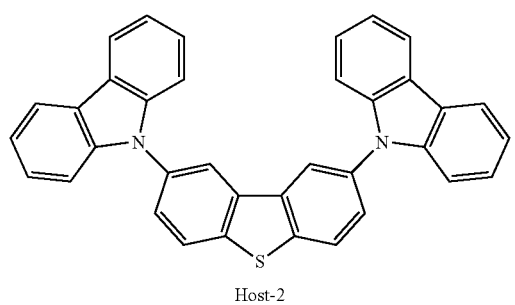

Host-2

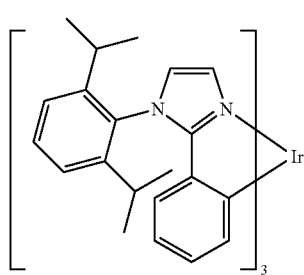

Blue Dopant-1

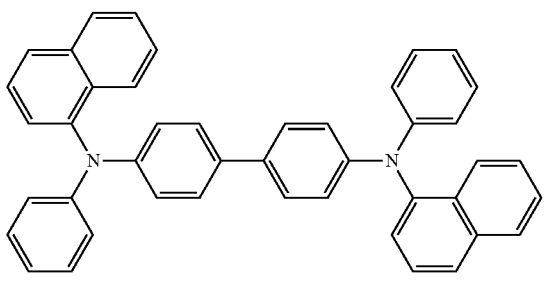

NPD

LG101 and LG201, available for purchase from LG Chemical Corporation of Seoul, Korea. NS60, available for purchase from Nippon Steel Chemical Company of Tokyo, Japan.

EXAMPLES

Example 1

All VTE White Device (Comparative Example)

As a comparative example, white OLEDs were fabricated using standard vacuum thermal evaporation (VTE) techniques to fabricate the entire device. These devices had the structure shown in FIG. 5. The materials and thicknesses of the layers were as follows:
ITO (80 nm)/LG101 (10 nm)/NPD (45 nm)/NS-60:Green Dopent:Red Dopant-1 (69:30:1; 20 nm)/Host-2:Blue Dopant-1: (80:20; 7.5 nm)/Host-2 (5 nm)/LG201 (45 nm)/ LiF/Al Seven VTE white devices were fabricated in different batches. The emission of these devices was measured, and the CIE coordinates of the devices are plotted in FIGS. 8 and 9. All seven devices were carefully made to have the same in structure, composition, and thickness. However, the colors are quite different by different batches. The average CIE coordinate of 7 batches is (0.424±0.007, 0.413±0.014).

The color difference between different devices can be described by MacAdam Ellipses, which are a well-known measure of human ability to differentiate color. A MacAdam Ellipse is a region on a CIE diagram inside of which a particular number of humans can not differentiate between colors. At a distance of one "step," from a target CIE coordinate, 68% of people can perceive a color difference. 68% is the percentage that falls within one standard deviation on a bell curve. At a distance of two steps, 95% of people can perceive a color difference, where 95% is the percentage that falls within two standard deviations on a bell curve, and so on. The lighting industry generally desires that the color of a light used for illumination be reproducible within a 3- or 4-step MacAdam ellipse. If color reproducibility is too low, a viewer looking at two sources of illumination would perceive significant differences. For example, the different panels of a ceiling light might appear to have different colors, or there might be a significantly perceivable variation within a panel, which is undesirable.

Figure 8:
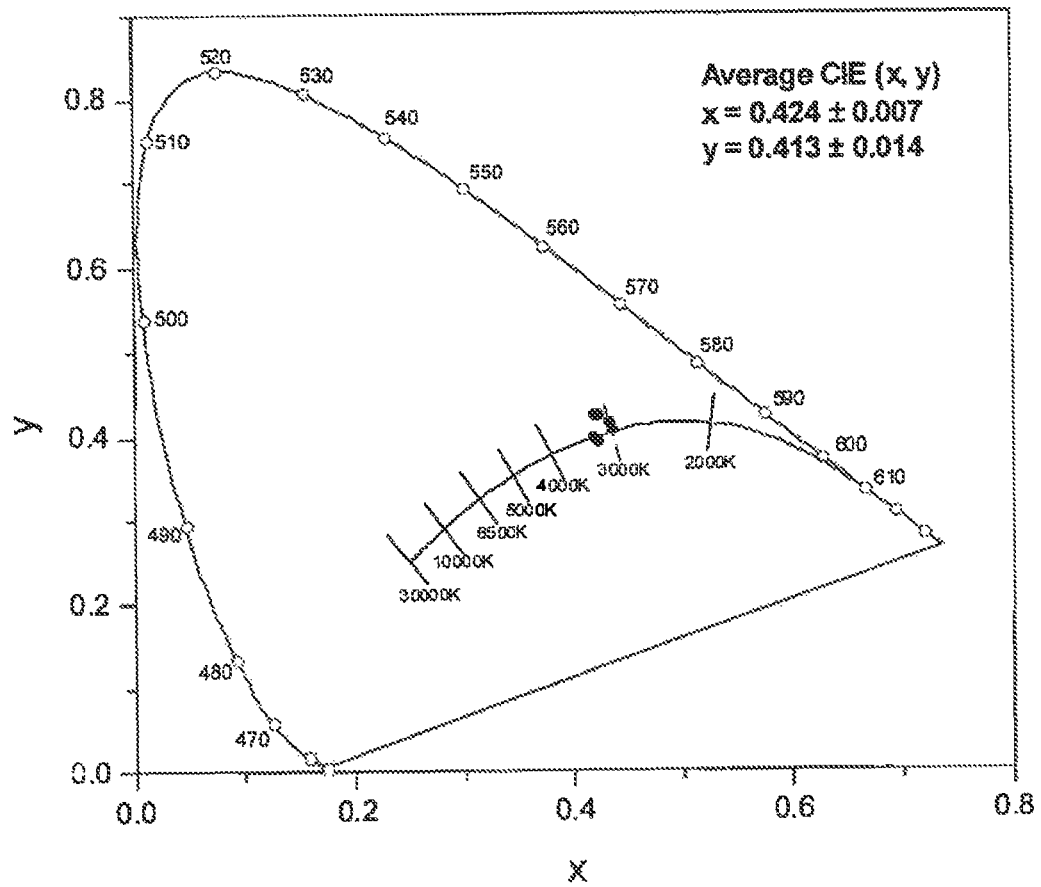
FIG. 8 shows a 1931 CIE diagram illustrating the variance in the CIE coordinates of devices fabricated using a vapor deposition technique.
Figure 9:
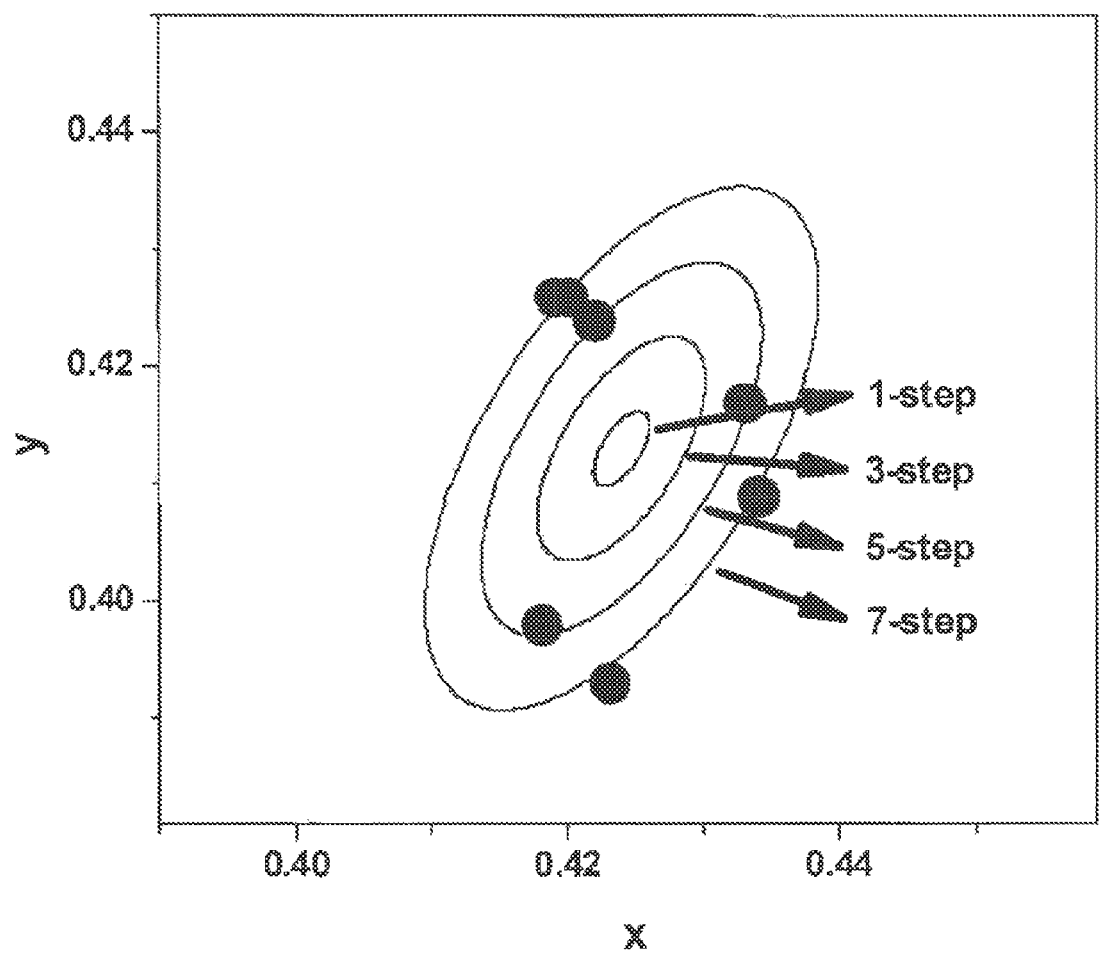
FIG. 9 shows a magnified portion of the 1931 CIE diagram of FIG. 8.
Figure 10:
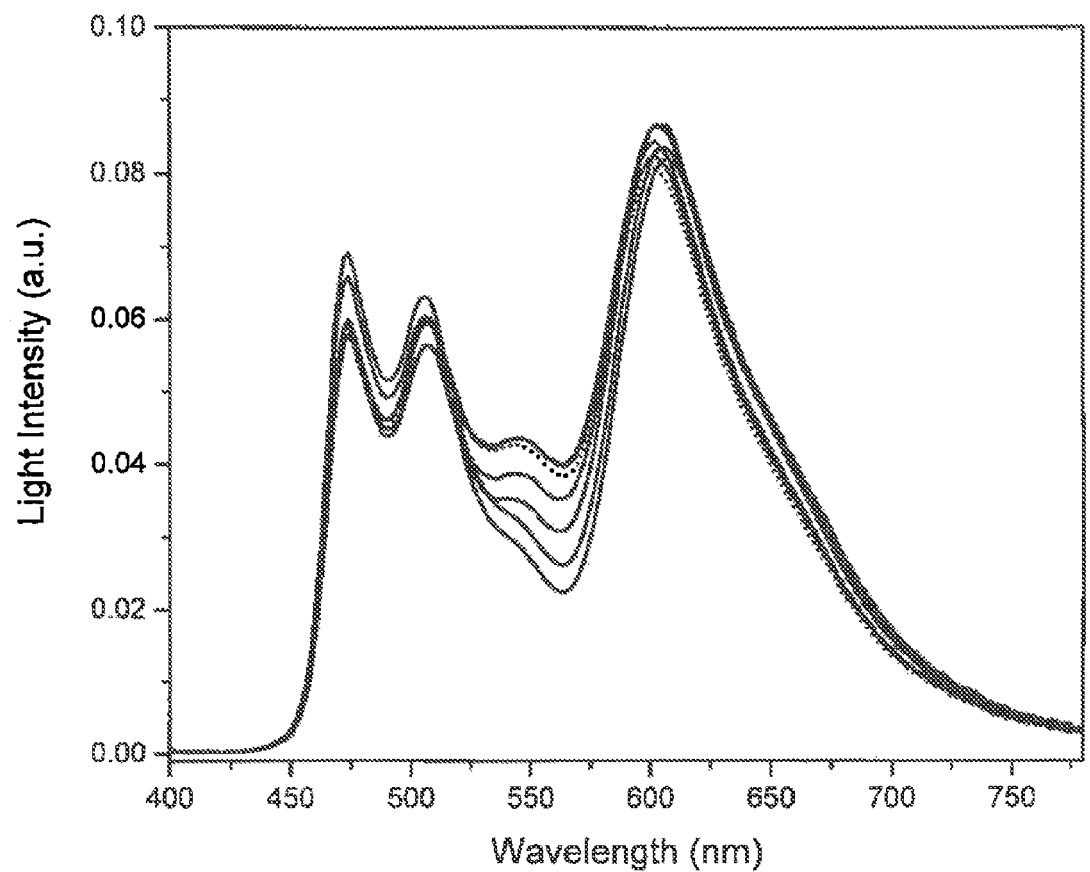
FIG. 10 shows spectra for the devices fabricated using a vapor deposition technique.

FIG. 8 shows the CIE coordinates of the seven devices having the structure shown in FIG. 5. FIG. 9 shows the same data as FIG. 8, but the relevant region of the diagram is magnified. FIG. 10 shows the measured spectra for the seven devices. It can be seen that there is a significant spread in the CIE coordinates of the different devices, and that they are all well outside of a 3-step MacAdam ellipse centered around the average of the CIE coordinates (0.424, 0.413) of the seven devices. The 7-step MacAdam ellipse can barely enclose the 7 device colors, which is out of industrial standard tolerance specification. This means that color reproducibility is not reliable for the VTE devices notwithstanding the care taken to achieve color reproducibility. The inventors attribute this variation in color to the sensitivity of the co-doped green and red emitting layer to the percentage of red dopant, and the relatively high variation in this percentage that occurs with a VTE deposition process.

Example 2

Hybrid White Device

A device was fabricated having the structure shown in FIG. 4. The hole injecting material HIL-1 (as the host material) along with Conducting dopant-1 were dissolved in a cyclohexanone solution. The amount of Conducting dopant-1 in the solution was 10 wt % relative to the host material HIL-1. The total concentration of the HIL-1 and Conducting dopant-1 was 0.5 wt % in cyclohexanone. To form the hole injection layer (HIL), the solution was spin-coated at 4000 rpm for 60 seconds onto a patterned indium tin oxide (ITO) electrode. The resulting film was baked for 30 minutes at 250° C. The film became insoluble after baking.

On top of the HIL, a hole transporting layer (HTL) and then emitting layer (EML) were also formed by spin-coating. The HTL was made by spin-coating a 1 wt % solution of the hole transporting material HTL-1 in toluene at 4000 rpm for 60 seconds. The HTL film was baked at 200° C. for 30 minutes. After baking, the HTL became an insoluble film.

The red and green EML was composed of a host material (Host-1) and a red and a green phosphorescent dopant (Red dopant-1 and Green dopant-1) as the emitting material. To form the EML, a toluene solution containing Host-1, Green dopant-1, and Red dopant (of total 0.75 wt %) with a Host-1:Green dopant-11:Red dopant-1 weight ratio of 87:12:1, was spin-coated onto the insoluble HTL at 1000 rpm for 60 seconds, and then baked at 100° C. for 60 minutes.

The blue EML was deposited using thermal evaporation. The 10 nm of blue host (Host-2) and Blue dopant-1 was co-evaporated with ratio of 90:10. On top of blue EML, 5 nm neat Host-2 was evaporated to build blocking layer (BL). The electron transport layer (containing Alq3), the electron injection layer (containing LiF), and the aluminum electrode were sequentially vacuum deposited.

When finished, the device of Example 2 had the structure: ITO (120 nm)/HIL-1:Conducting Dopant-1 (90:10; 5 nm)/HTL-1 (10 nm)/Host-1:Green Dopant-1:Red Dopant-1 (87:12:1; 25 nm)/Host-2:Blue Dopant-1: (90:10; 10 nm)/Host-2 (5 nm)/Alq (40 nm)/LiF/Al The CIE coordinate and spectrum of the hybrid white device of Example 2 are shown in FIGS. 6 and 7, respectively. The device performance is described in TABLE 1. At 1000 cd/m2, the power efficiency was 11 lm/W with color rendering index (CRI) 78, and correlated color temperature (CCT) corresponding to the white color was 2800K degree.

TABLE 1

Hybrid white device performances of Example 2

| | |
|---|---|
| Power Efficiency (lm/W) @ 1,000 cd/m2 | 11 |
| Correlated Color Temperature (CCT) (K) @ 1,000 cd/m2 | 2800 |
| Color Rendering Index (CRI) @ 1,000 cd/m2 | 78 |
| Color Coordinate, CIE(x, y) @ 1,000 cd/m2 | (0.453, 0.411) |
| Lifetime LT80 (hours) @ 4,000 cd/m2 | 100 |
| (A brightness decay to 80% of initial level 4,000 cd/m2) | |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:
1. A method comprising:
   a. providing a first electrode;
   b. depositing a first organic layer over the first electrode via solution processing, the first organic layer further comprising:
      i. an organic host material of the first organic layer;
      ii. a first organic emitting material of the first organic layer;
      iii. a second organic emitting material of the first organic layer;
      iv. a third organic emitting material of the first organic layer;
      wherein the first, the second, and the third organic emitting materials are co-doped in the organic host material;
   c. depositing a second electrode over the first organic layer; wherein the amount of the first organic emitting material of the first organic layer is measured to a variance of less than 5%.

2. The method of claim 1, wherein:
   a. the first organic emitting material of the first organic layer has a peak emissive wavelength in the visible spectrum of 590-700 nm;
   b. the second organic emitting material of the first organic layer has a peak emissive wavelength in the visible spectrum at 570-590 nm; and
   c. the third organic emitting material of the first organic layer has a peak emissive wavelength in the visible spectrum of 500-570 nm.

3. The method of claim 1, wherein the organic light emitting device emits light having a CIE coordinate of x coordinate in the range of 0.15-0.65, and y coordinate in the range of 0.1-0.7.

4. The method of claim 3, wherein the organic light emitting device emits light having a CIE coordinate of x coordinate in the range of 0.25-0.5, and y coordinate in the range of 0.2-0.5.

5. The method of claim 1, further comprising, prior to depositing a second electrode over the first organic layer:
   depositing a second organic layer over the first organic layer, the second organic layer further comprising:
      i. an organic host material of the second organic layer; and
      ii. an organic emitting material of the second organic layer.

6. The method of claim 5, wherein:
   the second organic layer is deposited by vapor deposition, wherein the organic host of the second organic layer and the organic emitting material of the second organic layer are co-deposited.

7. The method of claim 1, wherein the first organic emitting material of the first organic layer, the second organic emitting material of the first organic layer, and the organic emitting material of the second organic layer are all small molecule materials.

8. The product of claim 1, the fabrication process further comprising, prior to depositing the first organic layer:
   a. depositing a third organic layer comprising an organic material of the third organic layer over the first electrode via solution processing;
   b. depositing a fourth organic layer comprising an organic material of the fourth organic layer over the third organic layer via solution processing
      wherein the third organic layer does not dissolve when the fourth organic layer is deposited, and the fourth organic layer does not dissolve when the first organic layer is deposited.

9. The method of claim 1, wherein the amount of the second organic emitting material of the first organic layer is measured to a variance of less than 5%.

10. The method of claim 1, wherein the amount of the third organic emitting material of the first organic layer is measured to a variance of less than 5%.

11. The method of claim 1, wherein the amount of the organic host material of the first organic layer is measured to a variance of less than 5%.

12. The method of claim 5, wherein the second organic layer is deposited by solution processing and the organic emitting material of the second organic layer is measured to a variance of less than 5%.

13. The method of claim 5, wherein the organic host material of the second organic layer is measured to a variance of less than 5%.

* * * * *